(12) United States Patent
Tung

(10) Patent No.: US 7,700,388 B2
(45) Date of Patent: Apr. 20, 2010

(54) MANUFACTURING METHOD OF PIXEL STRUCTURE

(75) Inventor: Chun-Hao Tung, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 558 days.

(21) Appl. No.: 11/563,824

(22) Filed: Nov. 28, 2006

(65) Prior Publication Data
US 2007/0243648 A1 Oct. 18, 2007

(30) Foreign Application Priority Data
Apr. 14, 2006 (TW) .............................. 95113330 A

(51) Int. Cl.
*H01L 21/00* (2006.01)

(52) U.S. Cl. .................. 438/30; 257/E27.111; 257/72; 257/59; 257/57

(58) Field of Classification Search .................. 438/30, 438/158; 257/E27.111, 72, 57, 59; 349/42, 349/43, 46
See application file for complete search history.

(56) References Cited

U.S. PATENT DOCUMENTS

| 6,853,405 B2 * | 2/2005 | Lee | 349/39 |
|---|---|---|---|
| 6,906,776 B2 * | 6/2005 | Park et al. | 349/187 |
| 2003/0076452 A1 * | 4/2003 | Kim et al. | 349/43 |
| 2005/0073619 A1 | 4/2005 | Chen et al. | |
| 2006/0003479 A1 * | 1/2006 | Park et al. | 438/30 |

FOREIGN PATENT DOCUMENTS

| JP | 2004-054069 | 2/2004 |
|---|---|---|
| JP | 06-16904 | 6/2004 |
| KR | 2002-0064022 | 8/2002 |
| KR | 10-2005-0097175 | 10/2005 |
| TW | I220775 | 9/2004 |

* cited by examiner

*Primary Examiner*—Matthew C Landau
*Assistant Examiner*—Jessica Hall
(74) *Attorney, Agent, or Firm*—J.C. Patents

(57) ABSTRACT

A method of manufacturing a pixel structure is provided. A gate, a scan line, and at least one first auxiliary pattern are formed on a substrate. A gate insulating layer is formed on the substrate to cover the gate and the scan line and expose the first auxiliary pattern and a part of the scan line. A channel layer is formed on the gate insulating layer over the gate. A source, a drain, a data line, a top electrode, and at least one second auxiliary pattern are formed, wherein the data line is electrically connected to the exposed first auxiliary pattern and the second auxiliary pattern is electrically connected to the exposed scan line. A passivation layer and a pixel electrode are formed, and the pixel electrode is electrically connected to the drain and the top electrode.

11 Claims, 20 Drawing Sheets

MANUFACTURING METHOD OF PIXEL STRUCTURE

CROSS-REFERENCE TO RELATED APPLICATION

This application claims the priority benefit of Taiwan application serial no. 95113330, filed Apr. 14, 2006. All disclosure of the Taiwan application is incorporated herein by reference.

BACKGROUND OF THE INVENTION

1. Field of the Invention

The present invention relates to a manufacturing method of a pixel structure. More particularly, the present invention relates to a manufacturing method of a pixel structure suitable for a large-size display panel.

2. Description of Related Art

In modern society, well-developed multimedia technology has mostly benefited from the advance of semiconductor devices or display devices. As for displays, thin film transistor liquid crystal displays (TFT-LCDs) with the advantages of high picture quality, preferable space utilization efficiency, low power consumption, and no radiation have become a mainstream product in the market, such that TFTs have been widely used in the TFT-LCDs.

Generally, a TFT-LCD includes a plurality of pixels, wherein each pixel is driven by a data line and a scan line. When the size of LCDs becomes larger, the length of data lines and scan lines are increased correspondingly, which results in an increase of the resistance values of the data lines and scan lines. Furthermore, the increase of resolution of display panels incurs an increase in parasitic capacitance of the lines, thus resulting in an obvious RC delay effect. In other words, the charging time of the pixel structure close to a signal input end is apparently different from that of the pixel structure away from the signal input end, and thus problems of flickering of display, nonuniform brightness, or different charging rates occur, and the display quality is degraded.

SUMMARY OF THE INVENTION

Accordingly, an objective of the present invention is to provide a pixel structure to solve various problems resulting from the increase of the resistance values due to the increases of the lengths of a scan line and a data line of the large-size display panel.

Another objective of the present invention is to provide a method of manufacturing the pixel structure, so as to reduce the resistance values of the scan line and the data line.

In order to achieve the above and other objectives, the method of manufacturing the pixel structure provided by the present invention comprises forming a gate, a scan line connected to the gate, and at least one first auxiliary pattern. Next, an insulating layer, a semiconductor layer, an ohmic contact layer, and a photoresist layer are formed in sequence. Thereafter, a single exposure and development is performed on the photoresist layer to form a first portion and a second portion and expose the ohmic contact layer on the scan line and the first auxiliary pattern, wherein the first portion covers the ohmic contact layer above the gate and a part of the scan line and the second portion covers the other part that is not covered by the first portion and is not exposed. The ohmic contact layer and the semiconductor layer which are not covered by the photoresist layer are removed and a part of the insulating layer is exposed. After that, the second portion of the photoresist layer is removed. Subsequently, the semiconductor layer not covered by the first portion is removed and the exposed insulating layer is removed, so as to form a channel layer and a gate insulating layer. Afterwards, the first portion of the photoresist layer is removed. Next, a source, a drain, a data line electrically connected to the source, and at least one second auxiliary pattern are formed, wherein the data line and the first auxiliary pattern are connected in parallel, and the second auxiliary pattern and the scan line are connected in parallel. Next, the ohmic contact layer between the source and the drain is removed to form a TFT. And, a passivation layer and a pixel electrode are formed, wherein the pixel electrode is electrically connected to the TFT. In one embodiment of the present invention, the step of removing the ohmic contact layer between the source and the drain further comprises a step of removing a part of the thickness of the semiconductor layer.

The present invention further provides a method of manufacturing the pixel structure, which comprises forming a gate, a scan line connected to the gate, and at least one auxiliary pattern on a substrate. An insulating layer, a semiconductor layer, an ohmic contact layer, and a photoresist layer are formed in sequence. Afterwards, a single exposure and development is performed on the photoresist layer to form a first portion and a second portion, wherein the first portion covers the ohmic contact layer above a part of the scan line and a part of the gate and the second portion is adjacent to the first portion. Next, the ohmic contact layer and the semiconductor layer which are not covered by the photoresist layer are removed to expose a part of the insulating layer. Next, the second portion of the photoresist layer is removed. Subsequently, a part of the thickness of the semiconductor layer not covered by the first portion is removed and the exposed insulating layer is removed, so as to form a channel layer and an insulating layer. After that, the first portion of the photoresist layer is removed. A source, a drain, at least one second auxiliary pattern, and a data line connected to the source are formed to complete a TFT, wherein the data line and the first auxiliary pattern are connected in parallel, and the second auxiliary pattern and the scan line are connected in parallel. And, a passivation layer and a pixel electrode are formed, wherein the pixel electrode is electrically connected to the TFT through the passivation layer.

In one embodiment of the present invention, the insulating layer, the semiconductor layer, and the ohmic contact layer are successively formed.

In one embodiment of the present invention, when the gate, the scan line, and the first auxiliary patter are formed on the substrate, a bottom electrode line is further formed on the substrate. Next, the first portion of the formed photoresist layer covers a part of the ohmic contact layer above the bottom electrode line. When the source, the drain, the data line, and the second auxiliary pattern are formed, a top electrode is further formed above the bottom electrode line to complete the fabrication of a storage capacitor.

In one embodiment of the present invention, after the passivation layer is formed, a contact opening is further formed in the passivation layer, such that after the pixel electrode is formed on the passivation layer, the pixel electrode is electrically connected to the drain and the top electrode through the contact opening.

In one embodiment of the present invention, when the gate, the scan line, and the first auxiliary pattern are formed, a scan line terminal electrically connected to the scan line is formed on the substrate and a first conductive pattern is formed on the substrate. Furthermore, the formed gate insulating layer further comprises the exposed part of the scan line terminal and the exposed part of the first conductive pattern. Additionally, when the source, the drain, the data line, and the second auxiliary pattern are formed, a data line terminal electrically connected to the data line and a second conductive pattern are further formed, wherein the data line terminal is electrically connected to the exposed first conductive pattern and the second conductive pattern is electrically connected to the exposed scan line terminal.

In one embodiment of the present invention, when the pixel electrode is formed, a first contact pattern and a second contact pattern are formed respectively above the data line terminal and the second conductive pattern, wherein the first contact pattern is electrically connected to the data line terminal and the second contact pattern is electrically connected to the second conductive pattern.

In one embodiment of the present invention, the photoresist layer with the first portion and the second portion is formed by an exposure process using a halftone mask or a slit mask.

In one embodiment of the present invention, the passivation layer comprises an inorganic dielectric layer, an organic planarization layer, or the combination thereof.

In one embodiment of the present invention, the thickness of the first portion of the photoresist layer is larger than that of the second portion.

In the present invention, since the first auxiliary pattern is formed below the data line and electrically connected to the data line in parallel, and the second auxiliary pattern is formed above the scan line and electrically connected to the scan line in parallel, the resistance values of the scan line and the data line are reduced. Therefore, the present invention can solve the problems of large-size display panel resulting from the increase of the length of the scan line and the data line.

In order to the make aforementioned and other objects, features and advantages of the present invention comprehensible, preferred embodiment accompanied with figures are described in detail below.

BRIEF DESCRIPTION OF THE DRAWINGS

FIGS. 1-7 are schematic views of a pixel structure according to a preferred embodiment of the present invention, wherein

FIGS. 9-14 are schematic views of a pixel structure according to a preferred embodiment of the present invention, wherein

DESCRIPTION OF EMBODIMENTS

The First Embodiment

Figure 1:
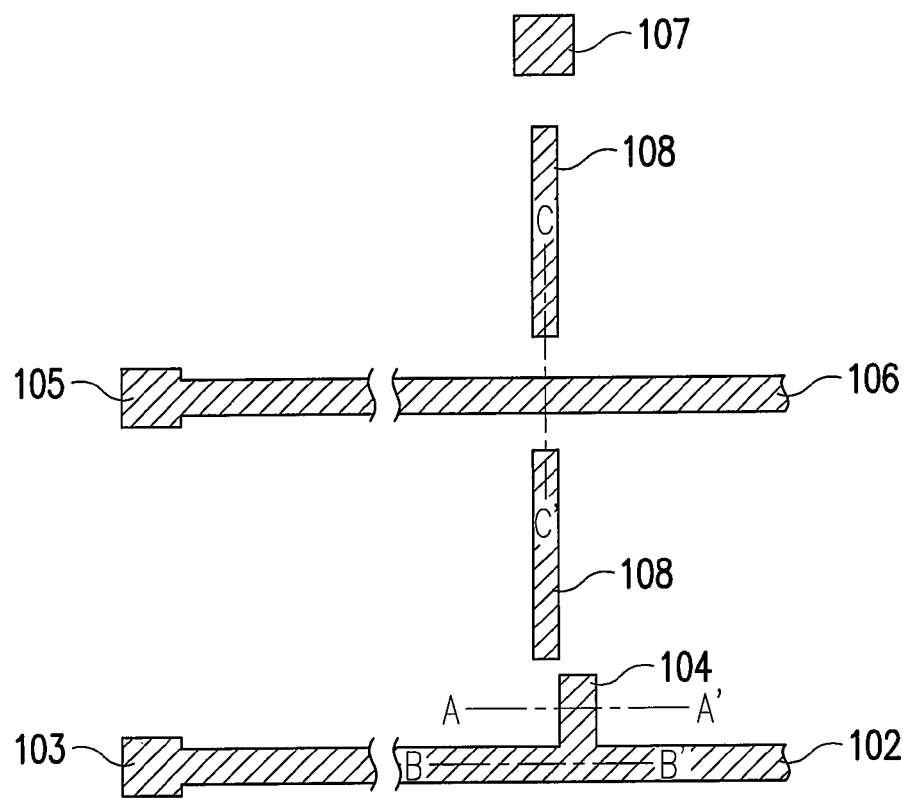
Figure 1A:
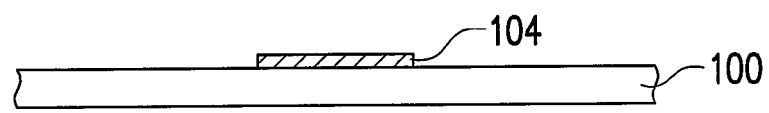
FIGS. 1A, 2A, 3A, 4A, 5A, 6A, and 7A are cross-sectional views along Line A-A' in FIGS. 1, 2, 3, 4, 5, 6, and 7, respectively.
Figure 1B:
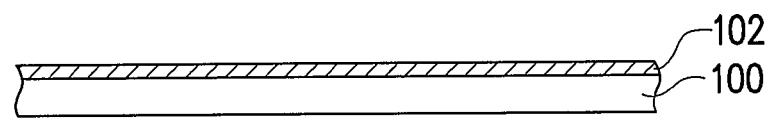
FIGS. 1B, 2B, 3B, 4B, 5B, 6B, and 7B are cross-sectional views along Line B-B' in FIGS. 1, 2, 3, 4, 5, 6, and 7, respectively.
Figure 1C:
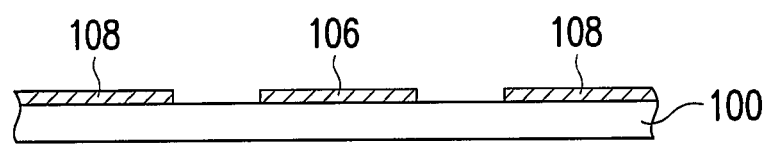
FIGS. 1C, 2C, 3C, 4C, 5C, 6C, and 7C are cross-sectional views along Line C-C' in FIGS. 1, 2, 3, 4, 5, 6, and 7, respectively.
Figure 2:
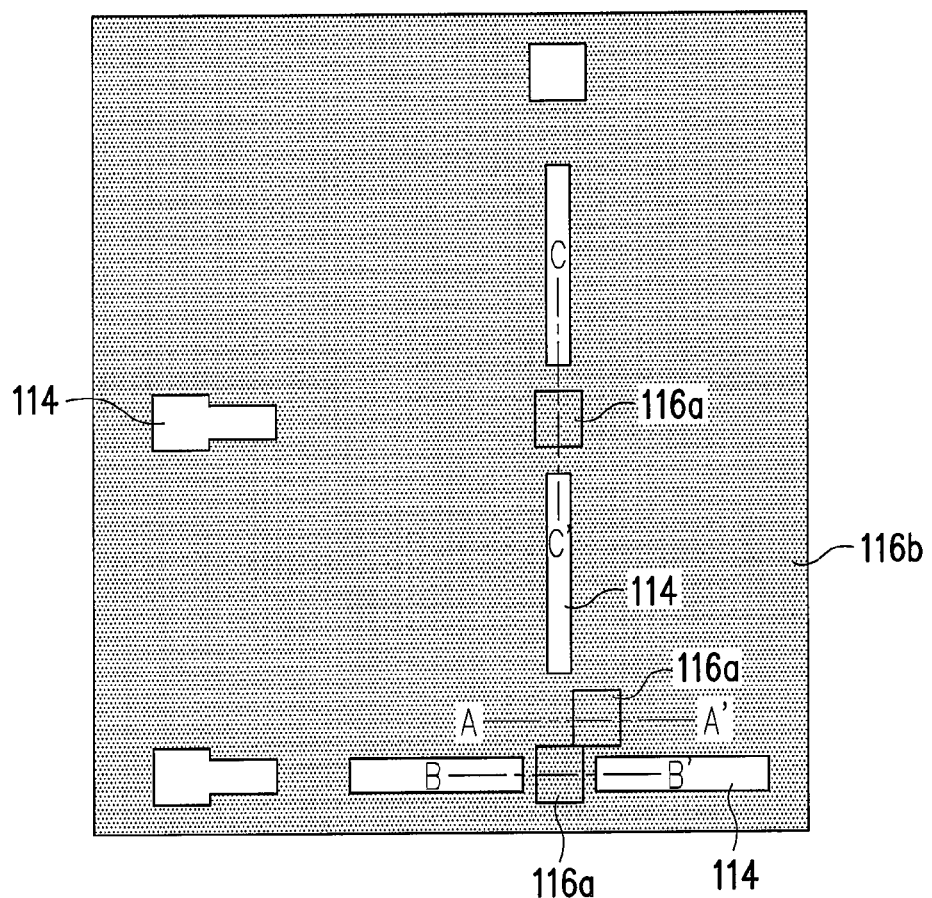
Figure 2A:
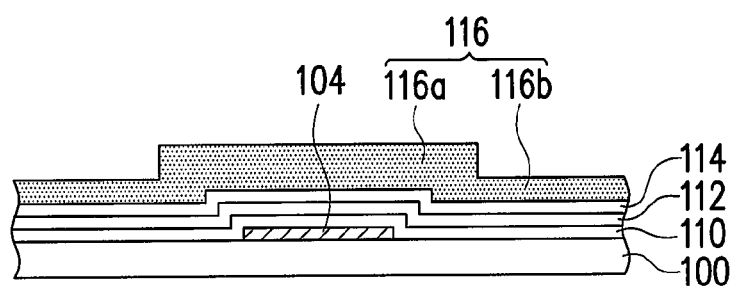
Figure 2B:
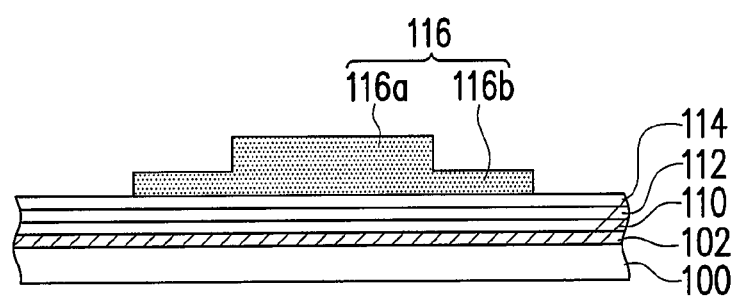
Figure 2C:
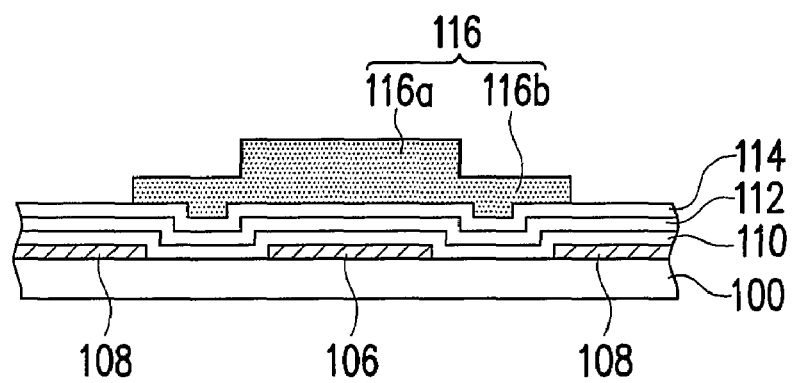
Figure 3:
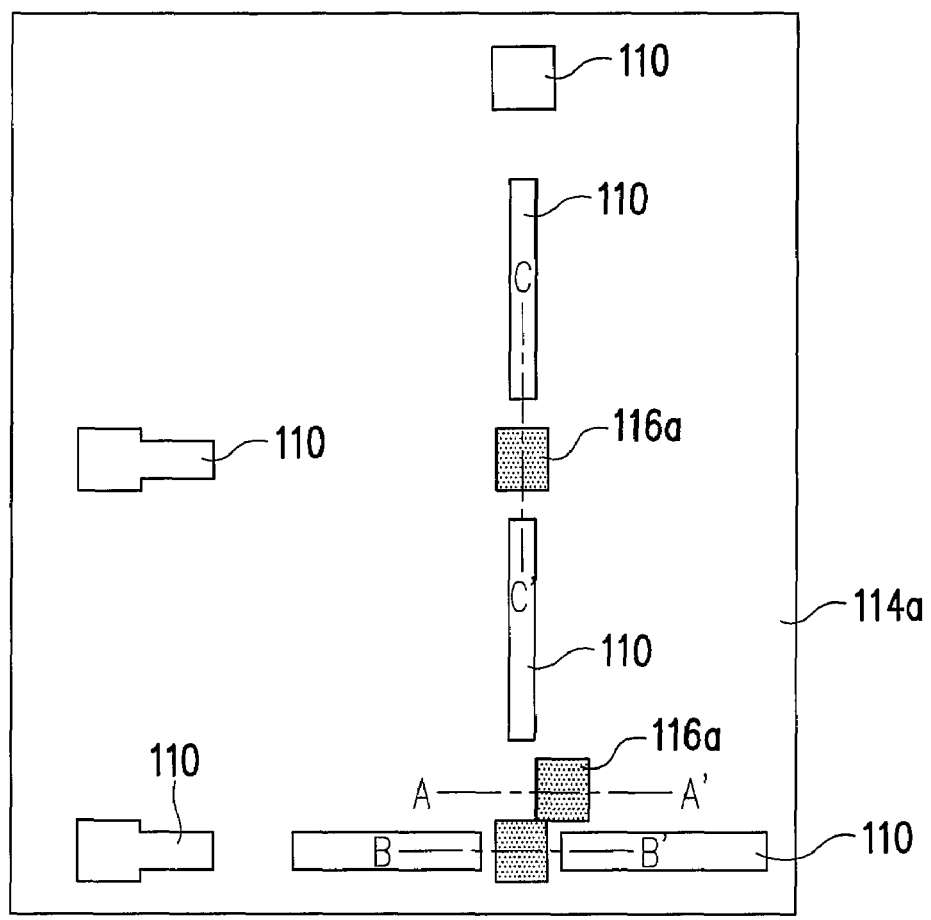
Figure 3A:
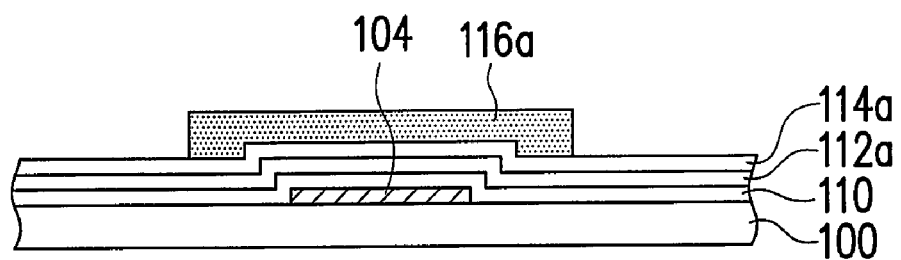
Figure 3B:
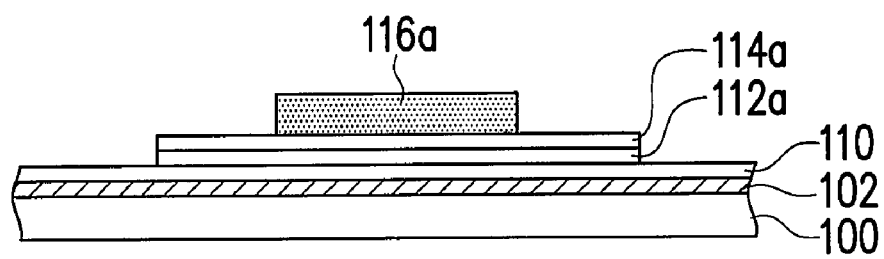
Figure 3C:
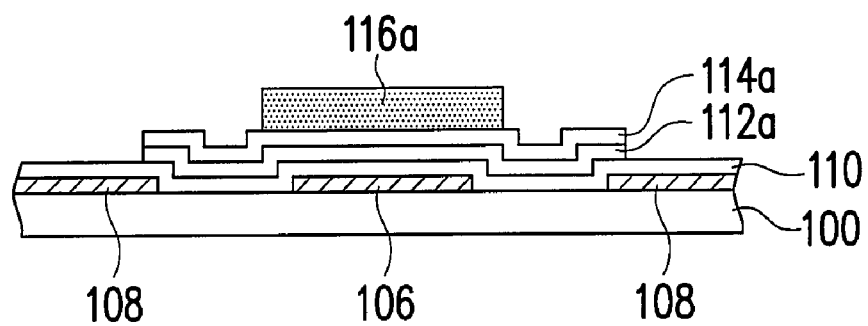
Figure 4:
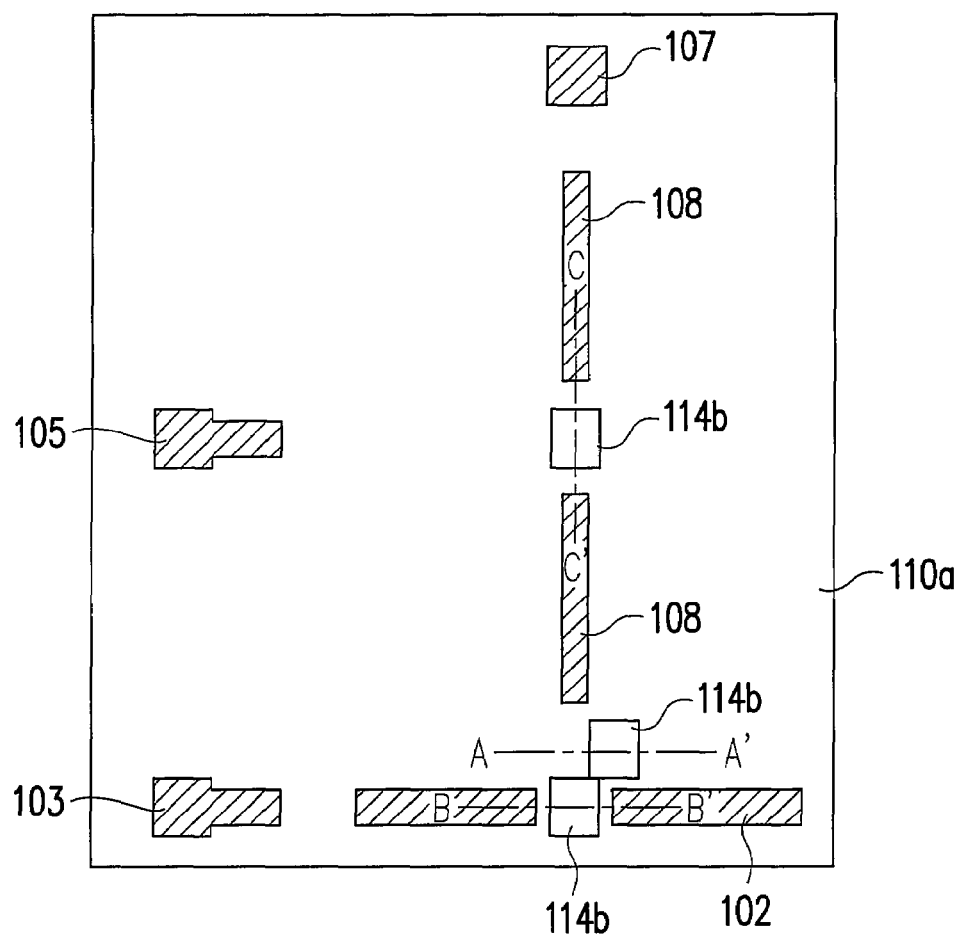
Figure 4A:
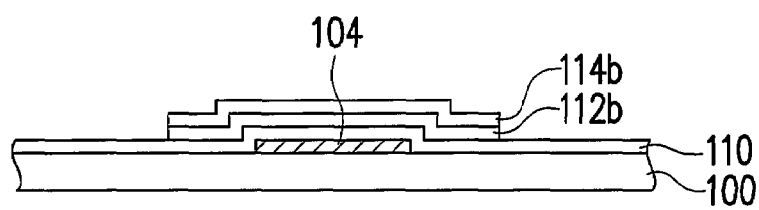
Figure 4B:
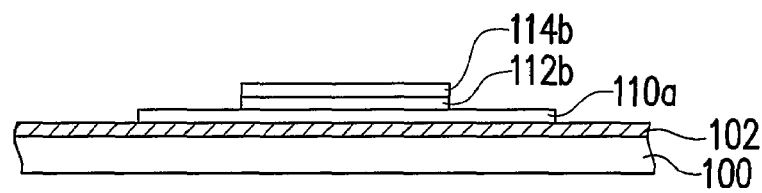
Figure 4C:
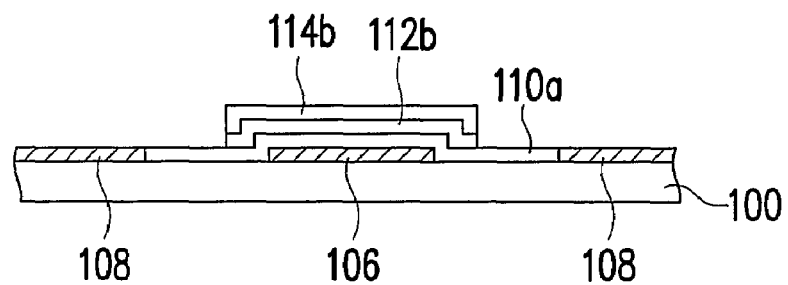

FIGS. 1-7 are top views of the method of manufacturing the pixel structure according to a preferred embodiment of the present invention, wherein FIGS. 1A, 2A, 3A, 4A, 5A, 6A, and 7A are cross-sectional views along Line A-A' in the top views, respectively; FIGS. 1B, 2B, 3B, 4B, 5B, 6B, and 7B are cross-sectional views along Line B-B' in the top views, respectively; and FIGS. 1C, 2C, 3C, 4C, 5C, 6C, and 7C are cross-sectional views along Line C-C' in the top views, respectively. First, referring to FIGS. 1, 1A, 1B, and 1C, a scan line 102, a gate 104 connected to the scan line 102, and at least one first auxiliary pattern 108 are formed on a substrate 100. In a preferred embodiment, the aforementioned step further comprises forming a bottom electrode line 106 on the substrate 100. In another preferred embodiment, the aforementioned step further comprises forming a scan line terminal 103 connected to the scan line 102 on the substrate 100. Additionally, a bottom electrode terminal 105 connected to the bottom electrode line 106 is further formed on the substrate 100. Furthermore, a first conductive pattern 107 is formed at the position where a data line terminal will be formed subsequently. The method of forming the components comprises, for example, depositing a conductive layer (not shown) on the substrate 100, and then performing a lithography process and an etching process to pattern the conductive layer, thereby defining each of the above components on the substrate 100. It should be noted that the first auxiliary pattern 108 is formed at the position where a data line will be formed subsequently, and the first auxiliary pattern 108 is cut off at the position where the scan line 102 and the bottom electrode line 106 are formed, so as to be separated from the scan line 102 and the bottom electrode line 106.

Next, referring FIGS. 2, 2A, 2B, and 2C, an insulating layer 110, a semiconductor layer 112, and an ohmic contact layer 114 are sequentially formed over the substrate. Next, a photoresist layer 116 is formed on the ohmic contact layer 114, wherein the photoresist layer 116 exposes the ohmic contact layer 114 above the scan line 102 and the first auxiliary pattern 108. The photoresist layer 116 comprises a first portion 116a and a second portion 116b. The thickness of the first portion 116a is larger than that of the second portion 116b, the first portion 116a covers the ohmic contact layer 114 above the gate 104, a part of the bottom electrode line 106, and a part of the scan line 102, and the second portion 116b covers the other part that is not covered by the first portion 116a and is not exposed by the photoresist layer 116. In a preferred embodiment, the photoresist layer 116 is patterned by a single exposure process and a single development process using a halftone mask or a slit mask.

Subsequently, a first etching process is performed by using the photoresist layer 116 as an etching mask to remove the ohmic contact layer 114 and the semiconductor layer 112 which are not covered by the photoresist layer 116, thereby exposing a part of the insulating layer 110. Next, the second portion 116b of the photoresist layer 116 is removed and the first portion 116a is retained, thus forming the structure as shown in FIGS. 3, 3A, 3B, and 3C. Next, a second etching process is performed by using the first portion 116a as an etching mask to remove the exposed insulating layer 110, and then the ohmic contact layer 114a and the semiconductor layer 112a which are not covered by the first portion 116a are removed. After that, the first portion 116a is removed to form the structure as shown in FIGS. 4, 4A, 4B, and 4C. At this time, the formed gate insulating layer 110a exposes a part of the scan line 102 and the first auxiliary pattern 108. In one preferred embodiment, the gate insulating layer 110a further exposes the scan line terminal 103, the bottom electrode line terminal 105, and the first conductive pattern 107. Meanwhile, a channel layer 112b made of semiconductor material and an ohmic contact layer 114b on the channel layer 112b are formed above the gate 104. Additionally, the semiconductor layer 112b and the ohmic contact layer 114b are also retained at the position where the scan line 102 and the data line (that will be subsequently formed) intersect, and the semiconductor layer 112b and the ohmic contact layer 114b are also retained at the position where the bottom electrode line 106 and the data line (that will be subsequently formed) intersect.

Thereafter, referring to FIGS. 5, 5A, 5B, and 5C, a source 118 and a drain 120 are formed on the ohmic contact layer 114b, and a data line 122 electrically connected to the source 118, a top electrode 126 on the gate insulating layer 110a above the bottom electrode line 106, and at least one second auxiliary pattern 124 are formed, wherein the data line 122 is electrically connected to the exposed first auxiliary pattern 108 and the second auxiliary pattern 124 is electrically connected to the exposed scan line 102. In a preferred embodiment, the aforementioned step further comprises forming a data line terminal 128 connected to the data line 122, wherein the data line terminal 128 is electrically connected to the first conductive pattern 107. Additionally, a second conductive pattern 130 is further formed on the scan line terminal 103 and contacts with the exposed scan line terminal 103. Furthermore, a third conductive pattern 132 is further formed on and electrically connected the bottom electrode line terminal 105. In one embodiment, the method of forming the above components comprises depositing a conductive layer and performing a lithography process and an etching process to pattern the conductive layer, thereby defining the above components. In particular, after the source 118 and the drain 112 are defined, the ohmic contact layer 114b between the source 118 and the drain 120 is further removed. In one preferred embodiment, the aforementioned step further comprises removing a part of the thickness of the semiconductor layer 112b to form a TFT which contains an ohmic contact layer 114c for contacting metal with the semiconductor. Additionally, the top electrode 126 and the bottom electrode line 106 respectively serve as two electrodes of a storage capacitor, and the gate insulating layer 110a between the two electrodes serve as a capacitor dielectric layer.

It should be noted that the data line 122 may contact the first auxiliary pattern 108 formed underneath and is electrically connected thereto, thus forming a parallel structure, such that the resistance value of the data line 122 is reduced. Besides the gate insulating layer 110a, the semiconductor layer 112b is also disposed at the position where the data line 122 and the scan line 102 intersect, so as to electrically isolate the two lines. Similarly, besides the gate insulating layer 110a, the semiconductor layer 112b is disposed at the position where the data line 122 and the bottom electrode line 106 intersect, so as to electrically isolate the two lines. Furthermore, the second auxiliary pattern 124 contacts the scan line 102 formed underneath and is electrically connected thereto, so as to form a parallel structure, such that the resistance value of the scan line 102 is reduced.

Figure 8A:
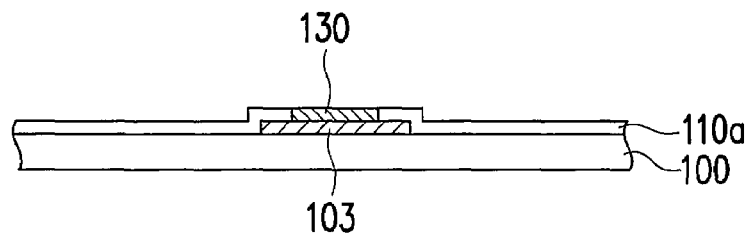
FIGS. 8A-8B are schematic sectional views of the manufacturing flow at the scan line terminal according to a preferred embodiment of the present invention.

Additionally, FIG. 8A is a cross-sectional view of the scan line terminal. Since the scan line terminal 103 can be exposed by the gate insulating layer 110a, after the second conductive pattern 130 is formed on the scan line terminal 103, the two directly contact and are electrically connected to each other. Similarly, the data line terminal 128 is electrically connected to the first conductive pattern 107 underneath and the bottom electrode line terminal 105 is electrically connected to the third conductive pattern 132 above. In the conventional method of manufacturing a pixel structure, the terminals and the conductive patterns cannot be electrically connected unless subsequently a contact process is performed and another conductive layer is disposed. Therefore, conventionally, the electrical property of the terminals cannot be checked until the contact process is performed. However, in the method of the present invention, the terminals are electrically connected to the conductive patterns at this time. Therefore, according to the present invention, the yield of the electrical connection of the terminals can be checked, and thus an unusual circumstance or the situation that the operation cannot be normally performed on the terminals, the scan line, and the data line can be detected in real time.

Next, referring FIGS. 6, 6A, 6B, and 6C, a passivation layer 140 is formed to cover the aforementioned components which include the source 118, the drain 120, the data line 122, the second auxiliary pattern 124, the top electrode 126, and so on. In one embodiment, the passivation layer 140 is an inorganic dielectric layer, an organic planarization layer, or the combination thereof. Subsequently, a first contact opening 142 and a second contact opening 144 are formed in the passivation layer 140 to respectively expose the drain 120 and the top electrode 126. In one embodiment, a contact opening 146 is further formed to expose the terminals which include the data line terminal, the scan line terminal, and the bottom electrode line terminal.

Figure 8B:
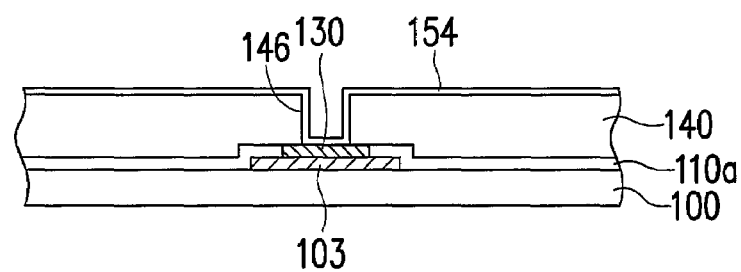
Figure 9:
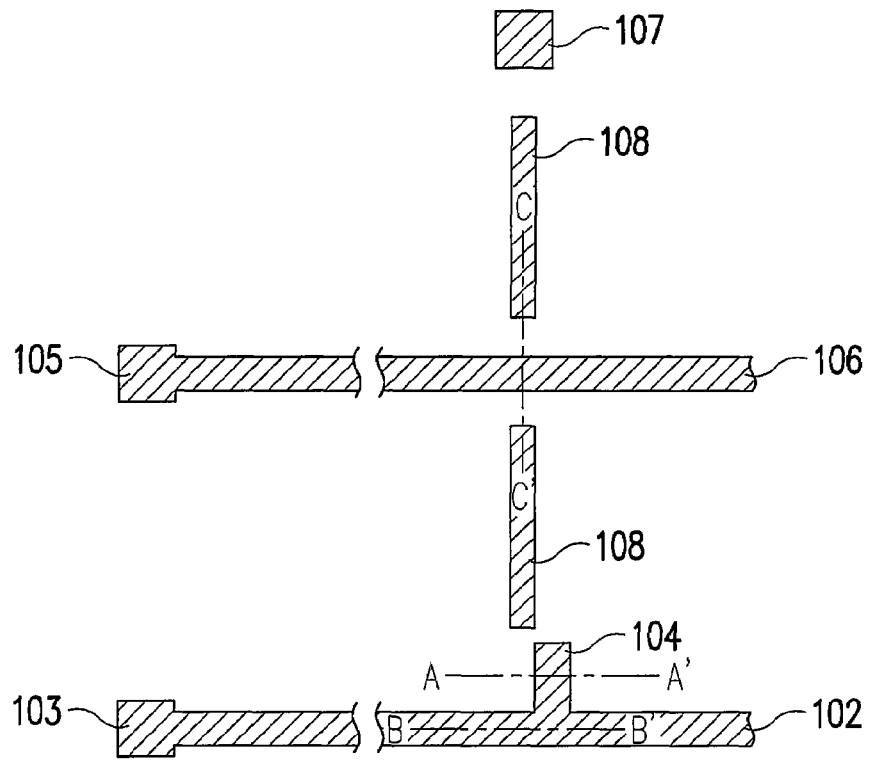
Figure 9A:
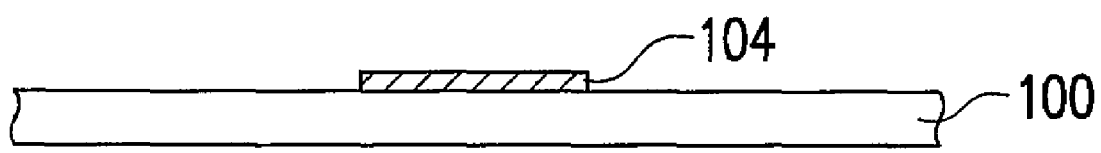
FIGS. 9A, 10A, 11A, 12A, 13A, and 14A are cross-sectional views along Line A-A' in FIGS. 9, 10, 11, 12, 13, and 14, respectively.
Figure 9B:
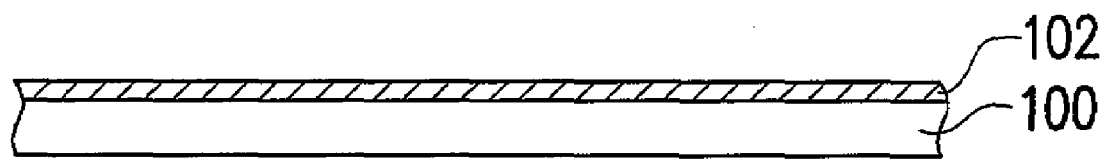
FIGS. 9B, 10B, 11B, 12B, 13B, and 14B are cross-sectional views along Line B-B' in FIGS. 9, 10, 11, 12, 13, and 14, respectively.
Figure 9C:
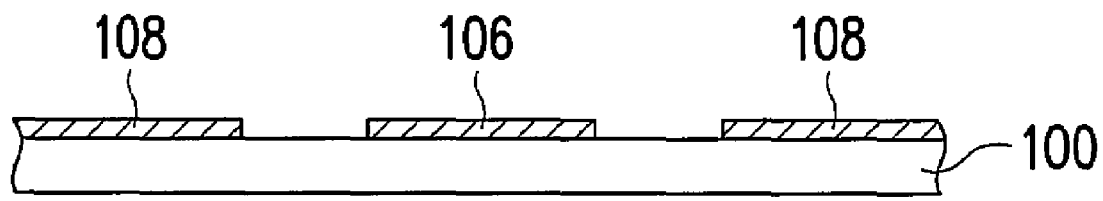
FIGS. 9C, 10C, 11C; 12C, 13C, and 14C are cross-sectional views along Line C-C' in FIGS. 9, 10, 11, 12, 13, and 14, respectively.
Figure 10:
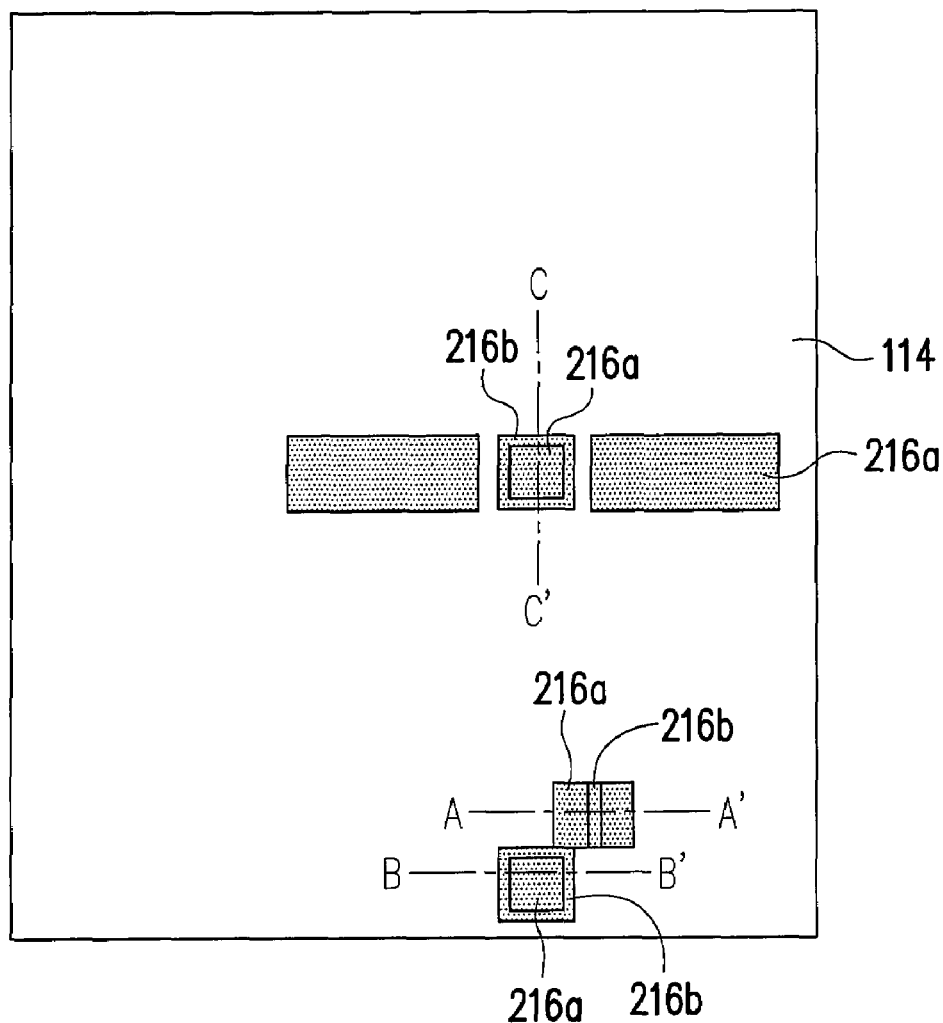
Figure 10A:
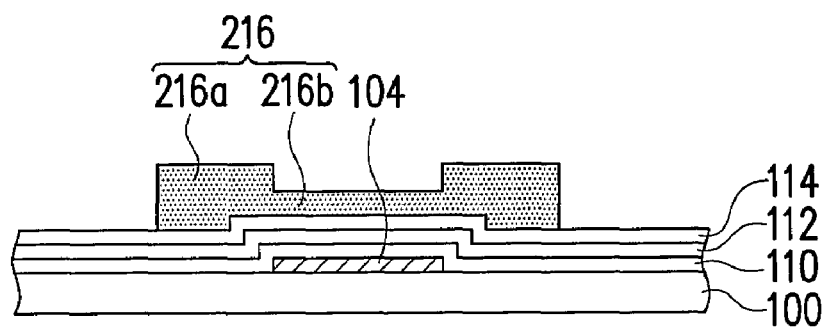
Figure 10B:
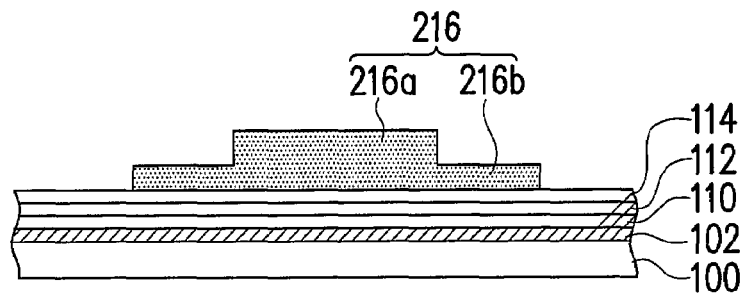
Figure 10C:
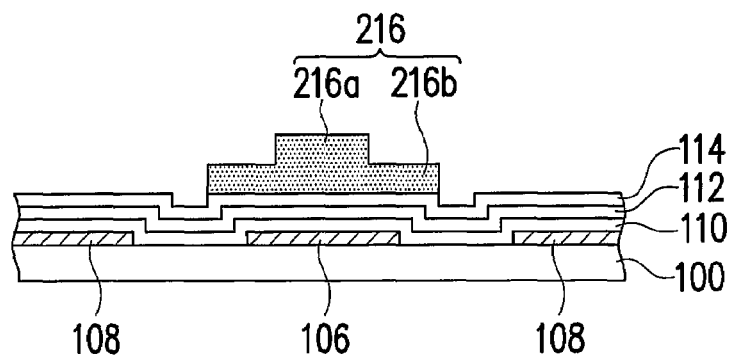
Figure 11:
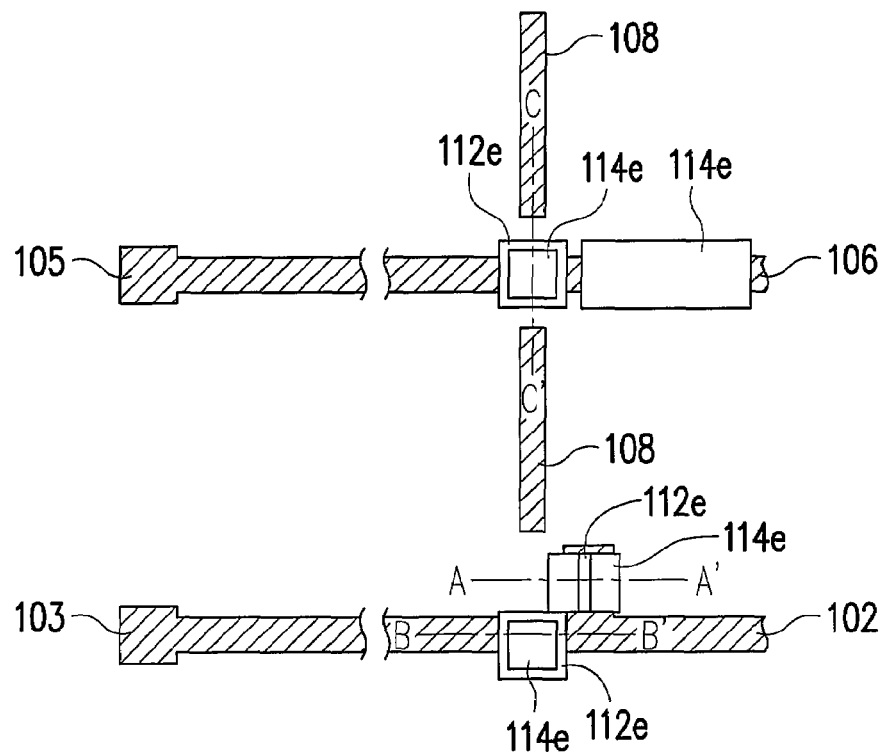
Figure 11A:
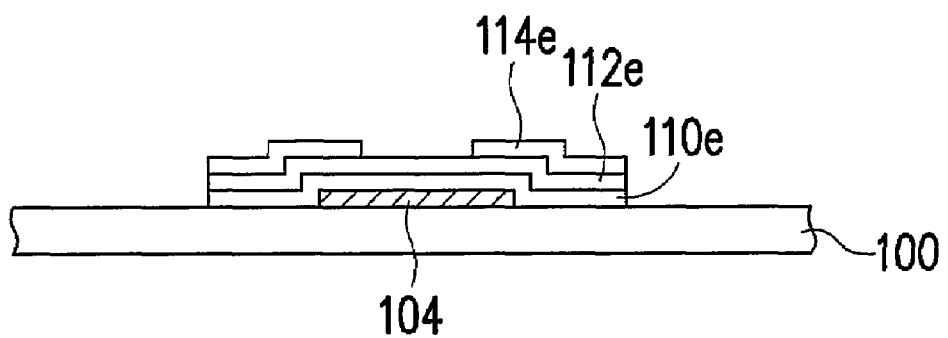
Figure 11B:
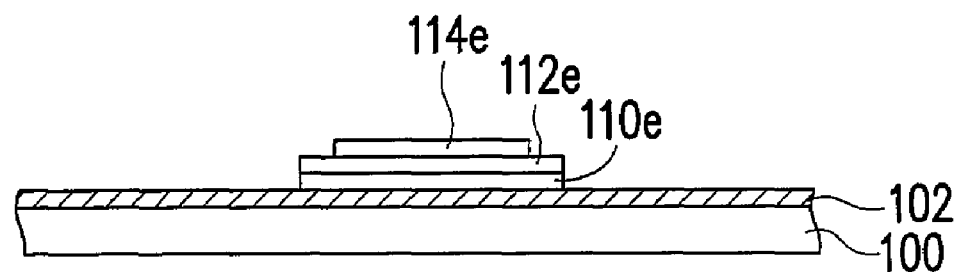
Figure 11C:
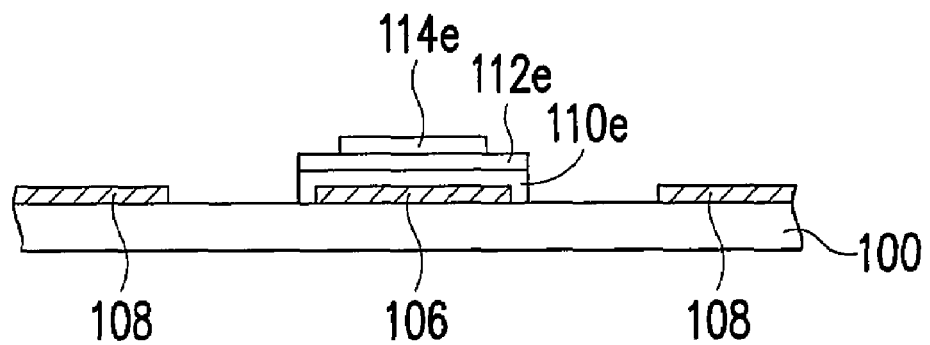
Figure 12:
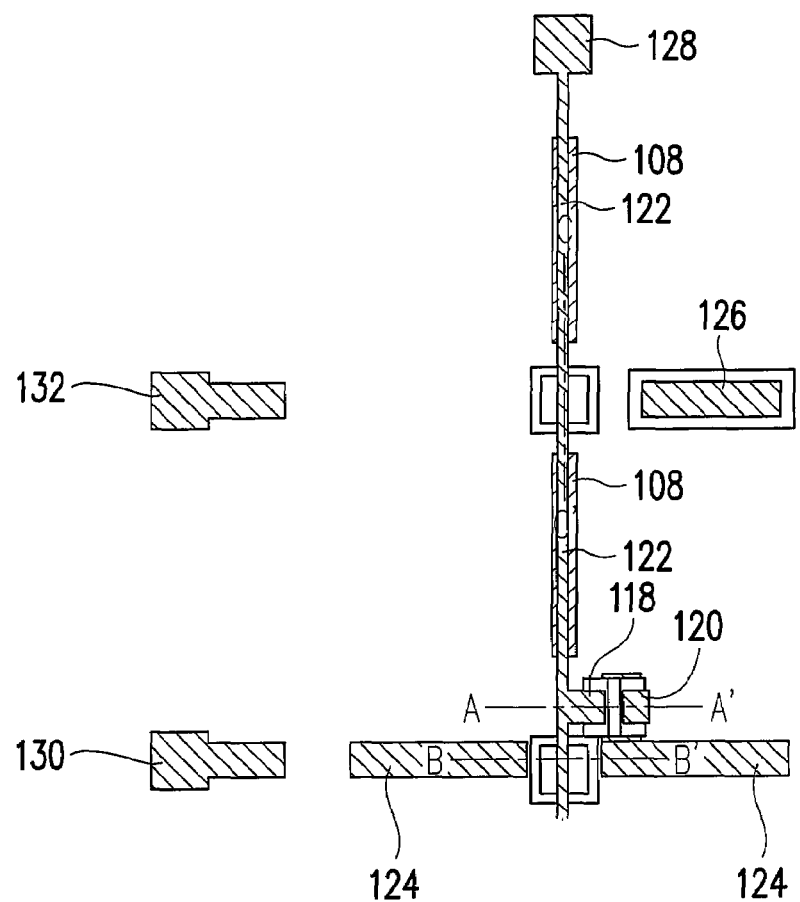
Figure 12A:
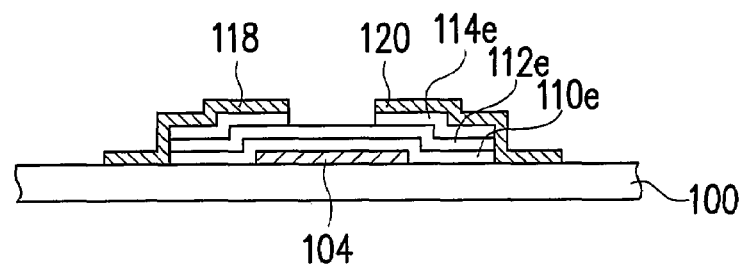
Figure 12B:
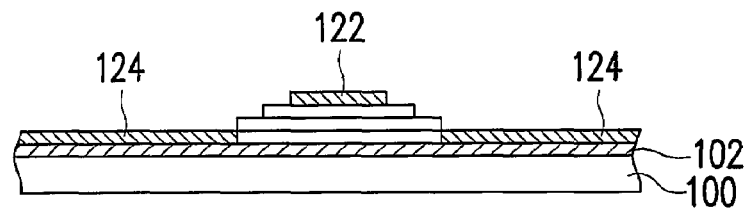
Figure 12C:
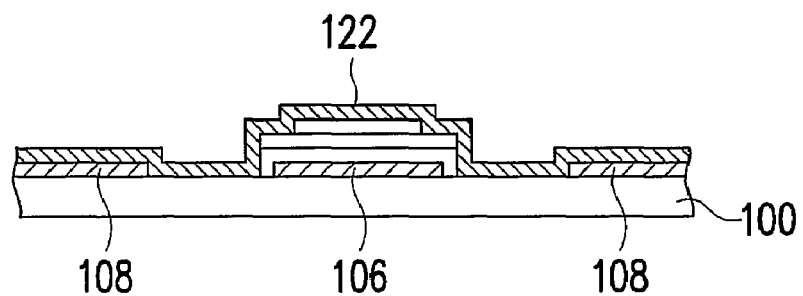
Figure 13:
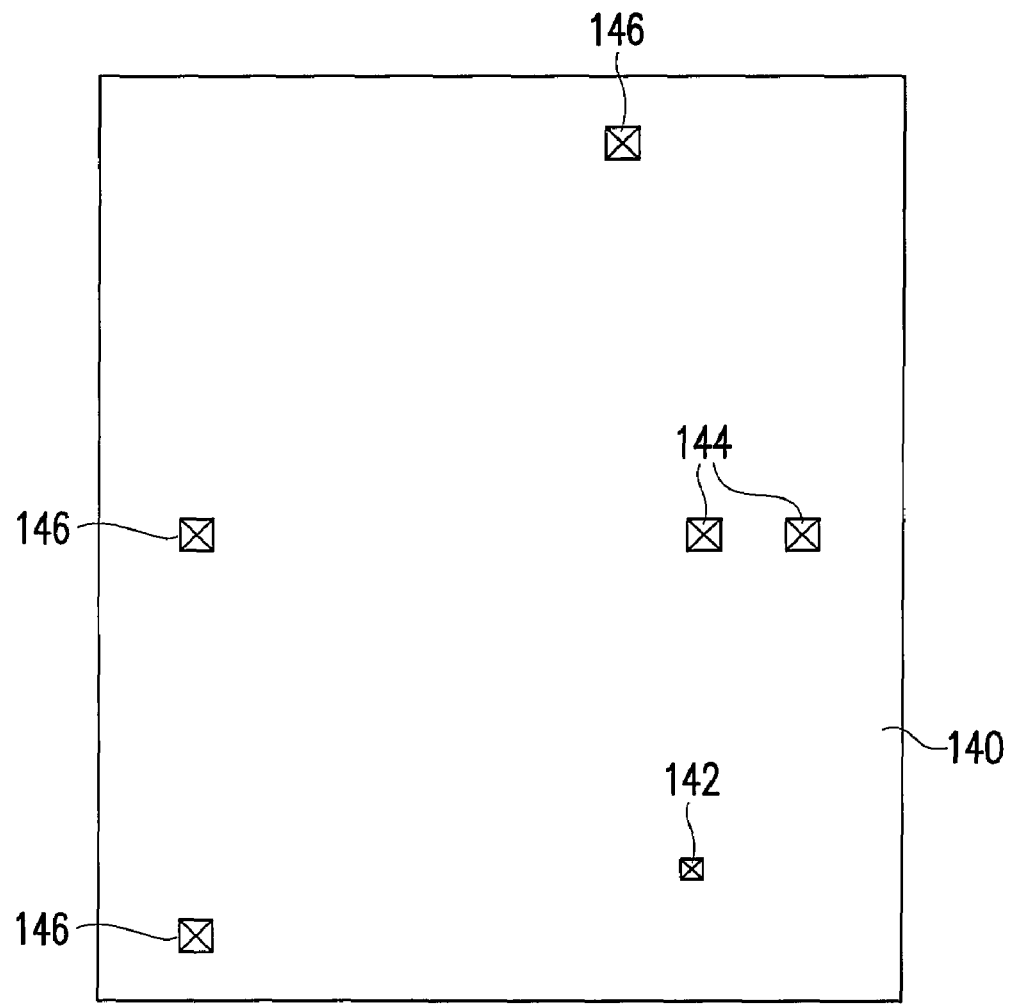
Figure 13A:
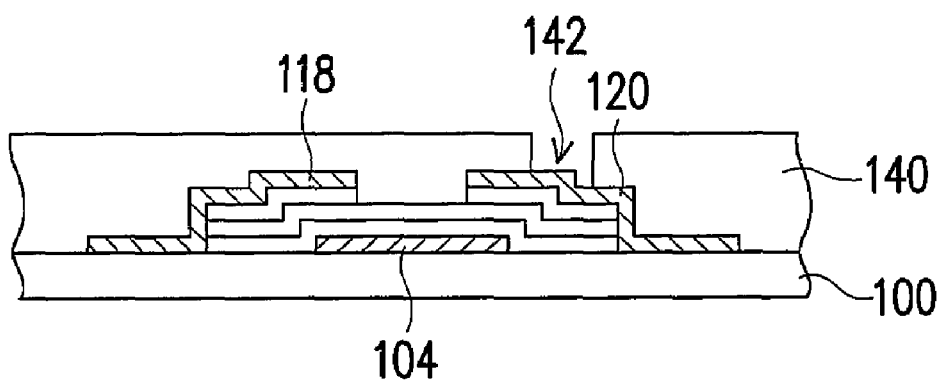
Figure 13B:
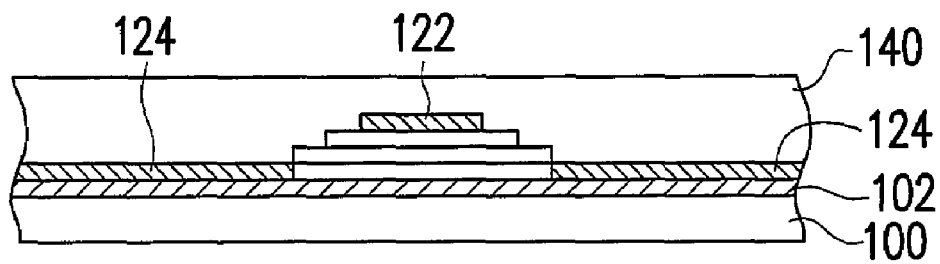
Figure 13C:
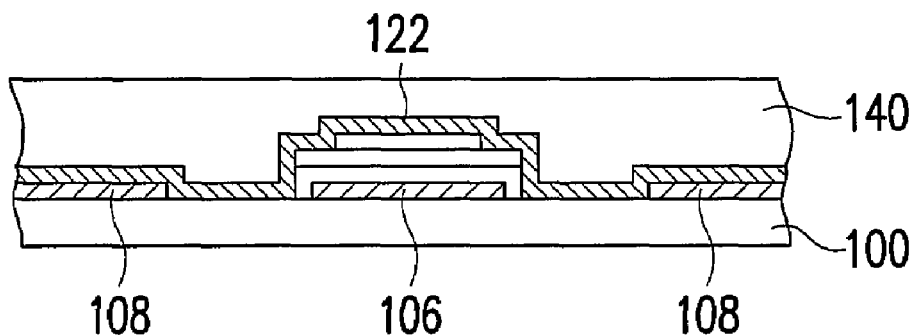
Figure 14:
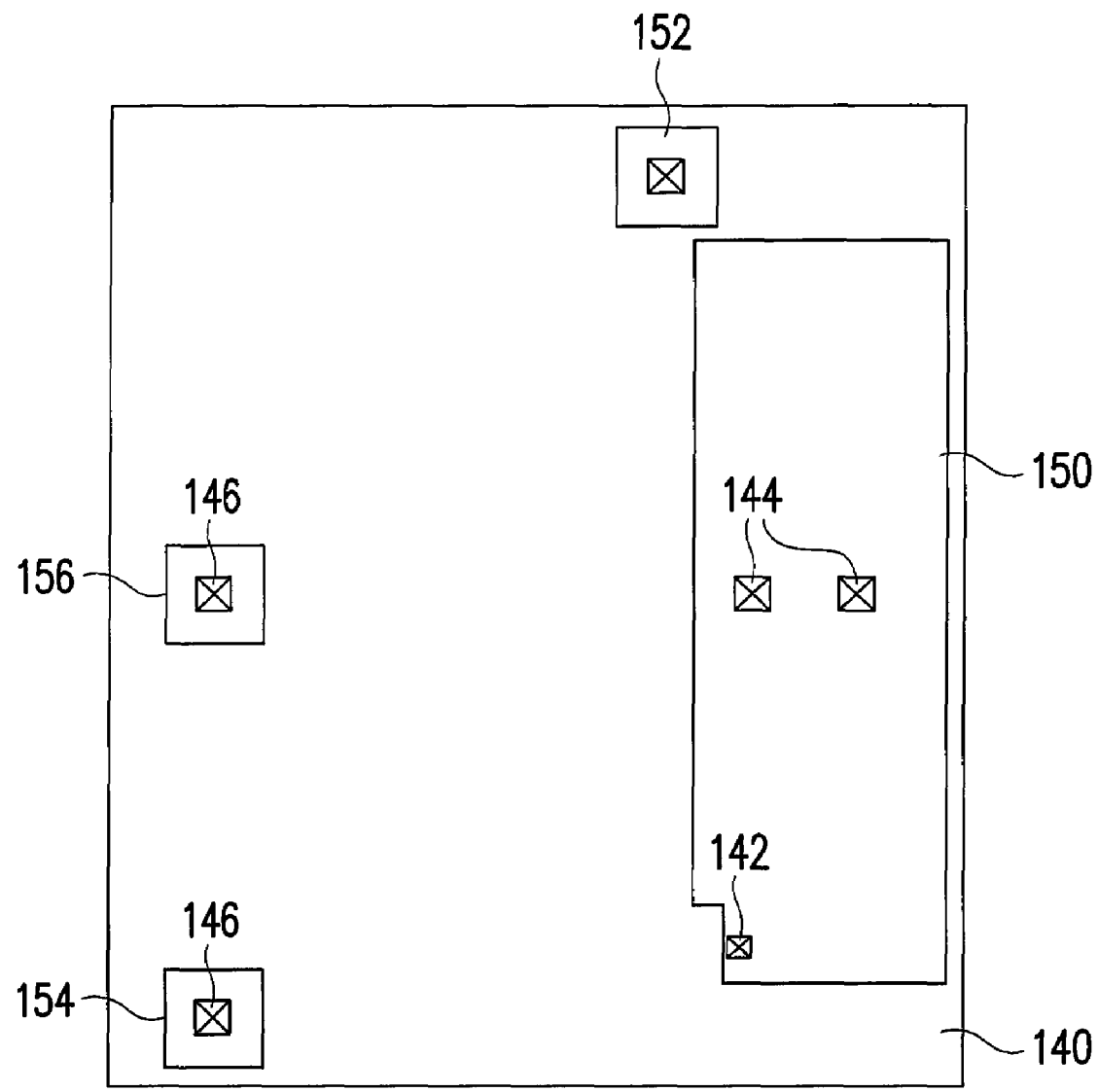
Figure 14A:
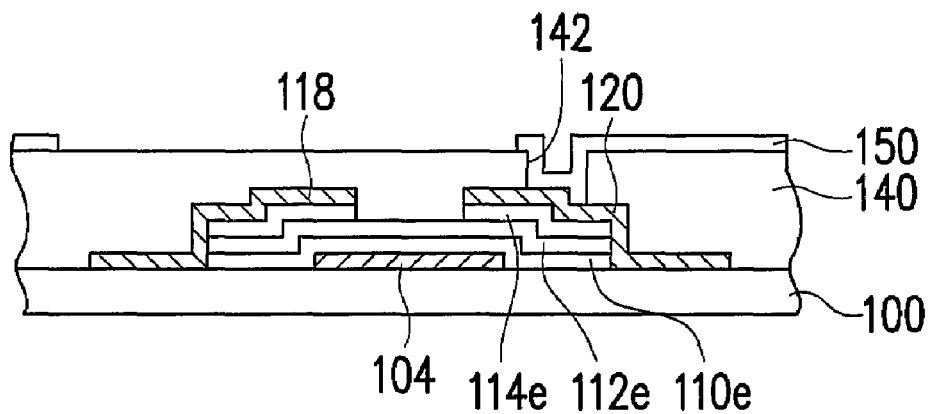
Figure 14B:
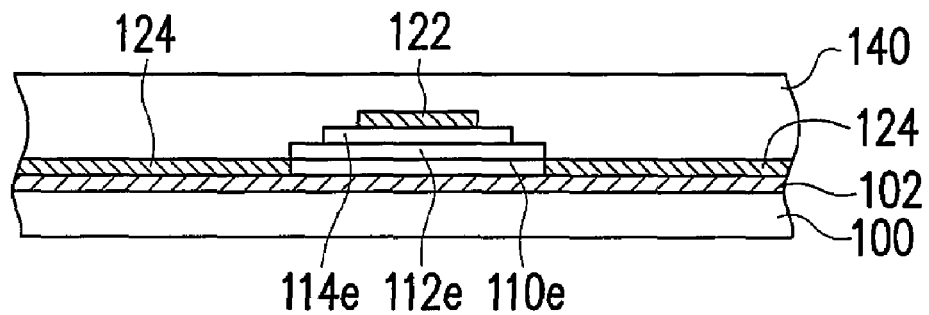
Figure 14C:
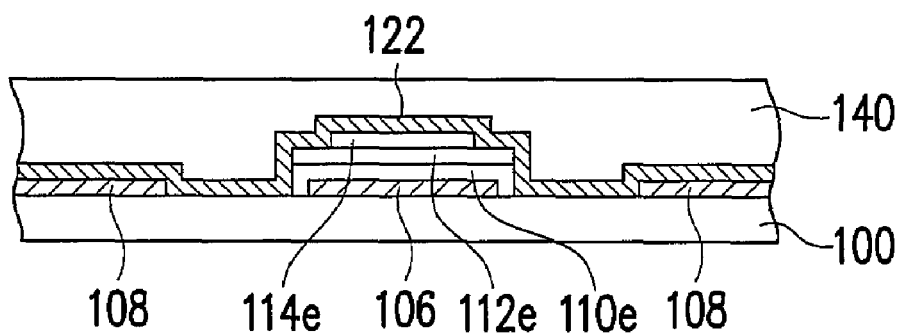

Next, referring to FIGS. 7, 7A, 7B, and 7C, a pixel electrode 150 is formed on the passivation layer 140, wherein the pixel electrode 150 is electrically connected to the drain 120 and the top electrode 126. Next, the pixel electrode 150 is electrically connected to the drain 120 and the top electrode 126 through the first contact opening 142 and the second contact opening 144. In one embodiment, when the pixel electrode 150 is formed, a first contact pattern 152, a second contact pattern 154, and a third contact pattern 156 are respectively formed above the data line terminal 128, the second conductive pattern 130, and the third conductive pattern 132, wherein the first contact pattern 152 is electrically connected to the data line terminal 128, the second contact pattern 154 is electrically connected to the second conductive pattern 130, and the third contact pattern 156 is electrically connected to the third conductive pattern 132. Taking the scan line terminal portion as an example, referring to FIG. 8B, a schematic sectional view of the scan line terminal is shown. The contact opening 146 formed in the passivation layer 140 exposes the second conductive pattern 130, the second contact pattern 154 is filled in the contact opening 146 and is electrically connected to the second conductive pattern 130, thereby being electrically connected to the scan line terminal 103.

After the pixel electrode is formed, the manufacturing of the pixel structure is completed. Subsequently, other film layers such as alignment films may be formed.

The Second Embodiment

FIGS. 9-14 are top views of the method of manufacturing the pixel structure according to another preferred embodiment of the present invention, wherein FIGS. 9A, 10A, 11A, 12A, 13A, and 14A are cross-sectional views along Line A-A' in the top views; FIGS. 9B, 10B, 11B, 12B, 13B, and 14B are cross-sectional views along Line B-B'; and FIGS. 9C, 10C, 11C, 12C, 13C, and 14C are cross-sectional views along Line C-C'. First, referring to FIGS. 9, 9A, 9B, and 9C, a scan line 102, a gate 104 connected to the scan line 102, and at least one first auxiliary pattern 108 are formed on a substrate 100. In a preferred embodiment, the aforementioned step further comprises forming a bottom electrode line 106 on the substrate 100. In another preferred embodiment, the aforementioned step further comprises forming a scan line terminal 103 connected to the scan line 102 on the substrate 100. Additionally, a bottom electrode terminal 105 connected to the bottom electrode line 106 is further formed on the substrate 100. Furthermore, a first conductive pattern 107 is further formed at the position where a data line terminal will be formed subsequently. The step is the same as or similar to that of the first embodiment as shown in FIG. 1, and the details will not be described herein again.

Then, referring to FIGS. 10, 10A, 10B, and 10C, an insulating layer 110, a semiconductor layer 112, and an ohmic contact layer 114 are sequentially deposited over the substrate. Next, a photoresist layer 216 is formed on the ohmic contact layer 114, wherein the photoresist layer 216 comprises a first portion 216a and a second portion 216b, the thickness of the first portion 216a is larger than that of the second portion 216b, the first portion 216a covers the ohmic contact layer 114 above a part of the scan line 102, a part of the bottom electrode line 106, and a part of the gate 104, and the second portion 216b is adjacent to the first portion 216a. Subsequently, a first etching process is performed by using the photoresist layer 216 as an etching mask to remove the ohmic contact layer 114 and the semiconductor layer 122 which are not covered by the photoresist layer 216, so as to expose a part of the insulating layer 110. Then, the second portion 216b of the photoresist layer 216 is removed and the first portion 216a is retained. A second etching process is further performed to remove the ohmic contact layer 114 not covered by the first portion 216a and further remove a part of the thickness of the semiconductor layer 112. Furthermore, the exposed insulating layer 110 is removed to form an ohmic contact layer 114e, a channel layer 112e, and a gate insulating layer 110e. Next, after the first portion 216a is removed, the structure as shown in FIGS. 11, 11A, 11B, and 11C is formed.

In this embodiment, the pattern of the photoresist layer 216 is different from that of the photoresist layer 116 in the first embodiment. Therefore, the structure (FIG. 11) formed after the photoresist layer 216 is removed is slightly different from the structure (FIG. 4) formed after the photoresist layer 116 is removed in the first embodiment. In the structure (FIG. 11) of the present embodiment, the insulation layer 110 at several positions will be removed to expose the surface of the substrate 100, and in the structure (FIG. 4) of the first embodiment, the surface of the substrate 100 is still covered by the insulating layer 110.

Figure 5:
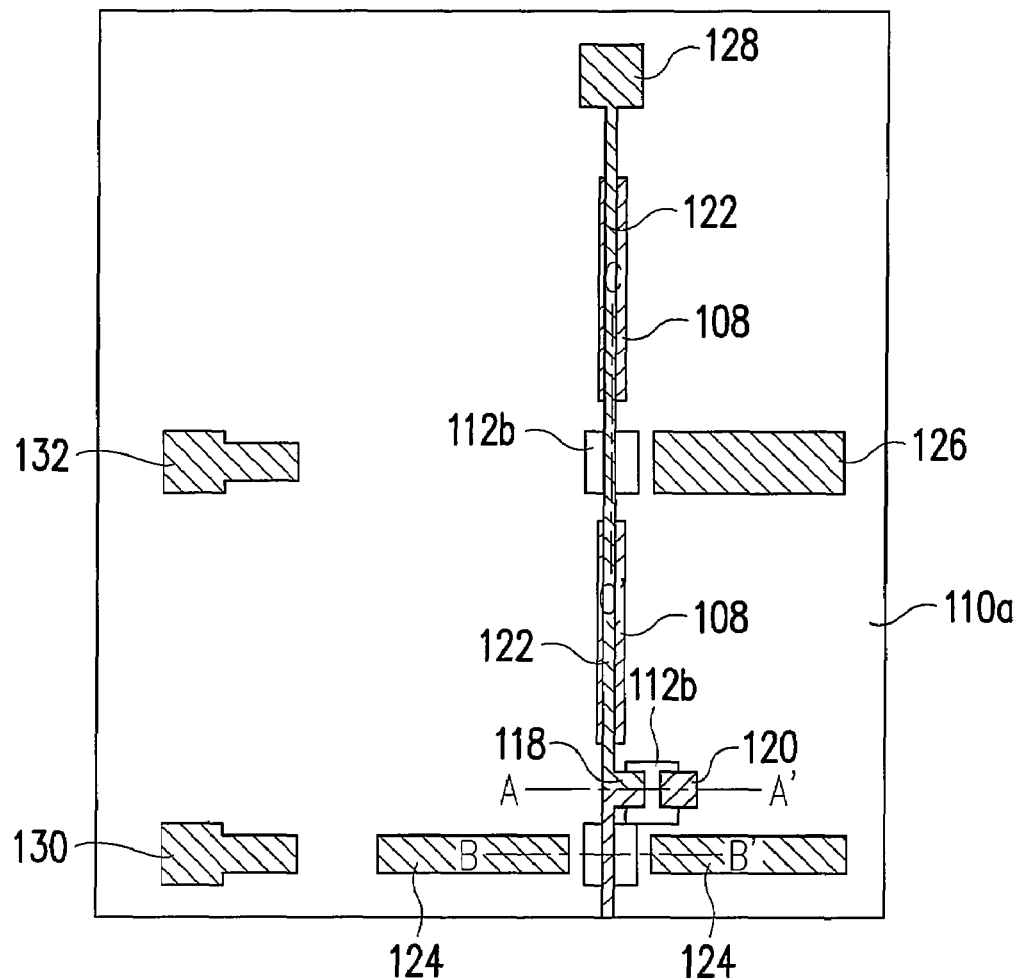
Figure 5A:
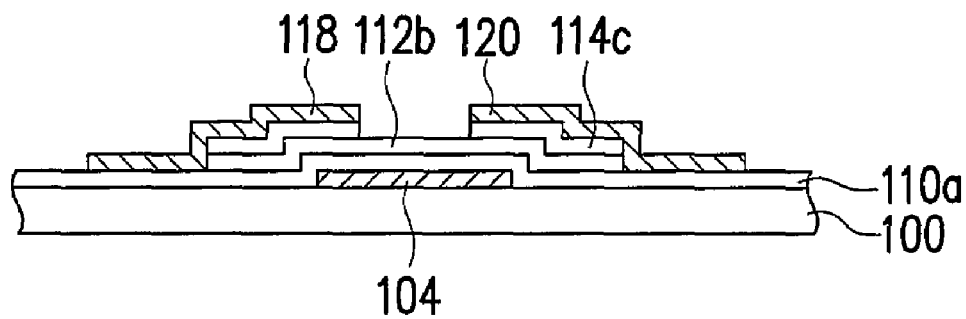
Figure 5B:
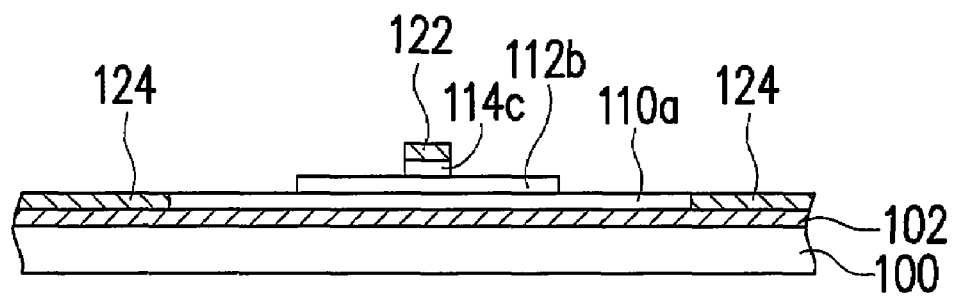
Figure 5C:
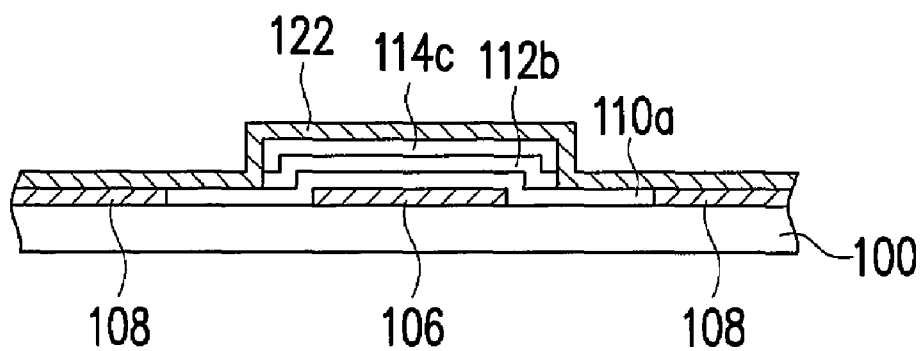
Figure 6:
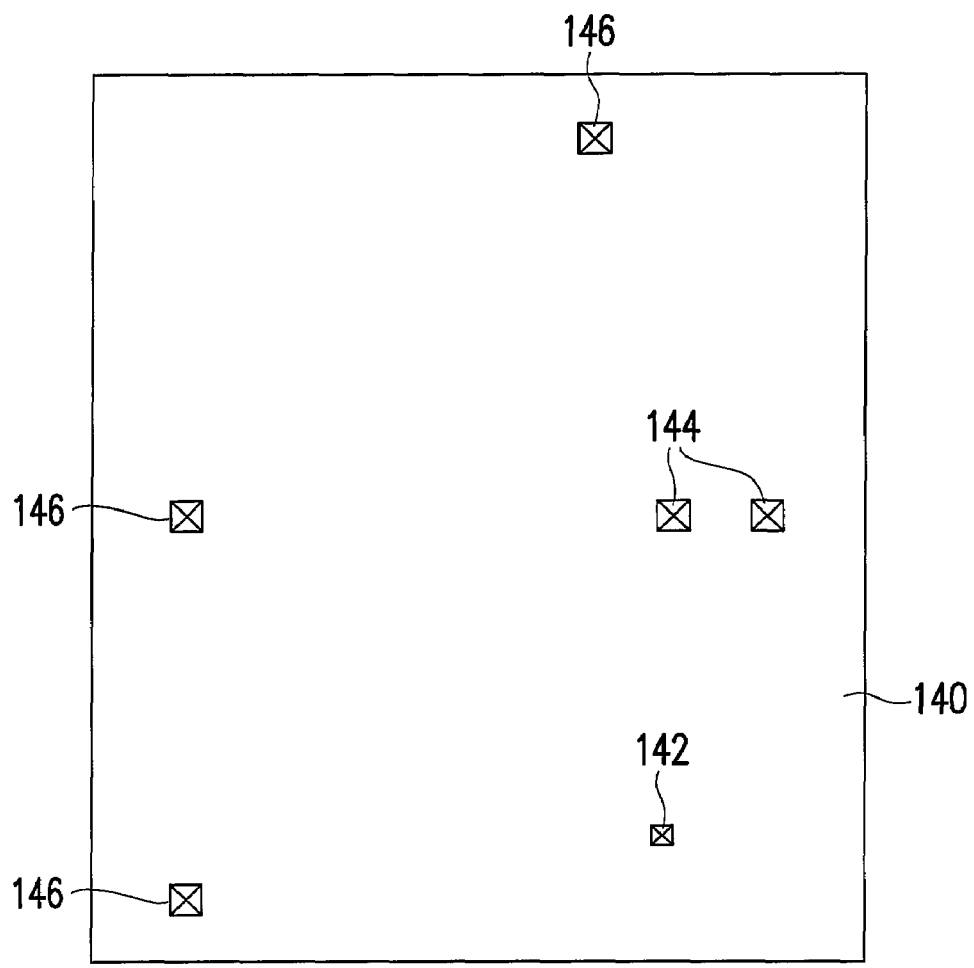
Figure 6A:
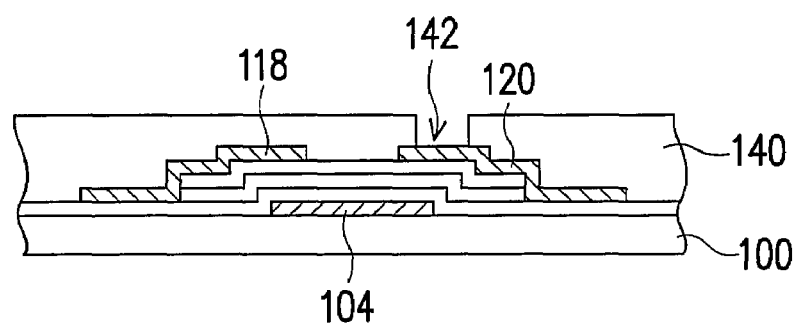
Figure 6B:
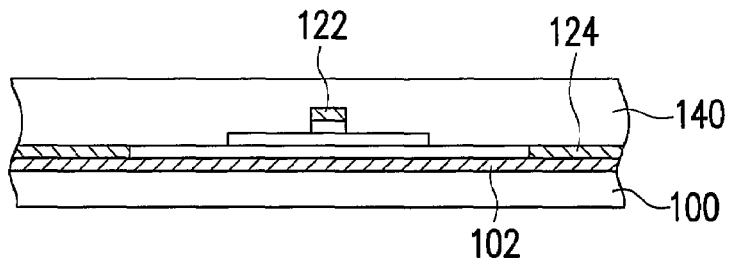
Figure 6C:
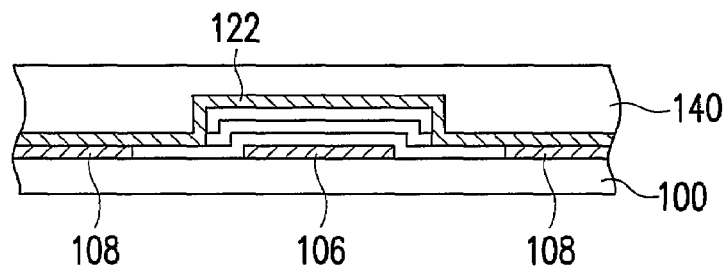
Figure 7:
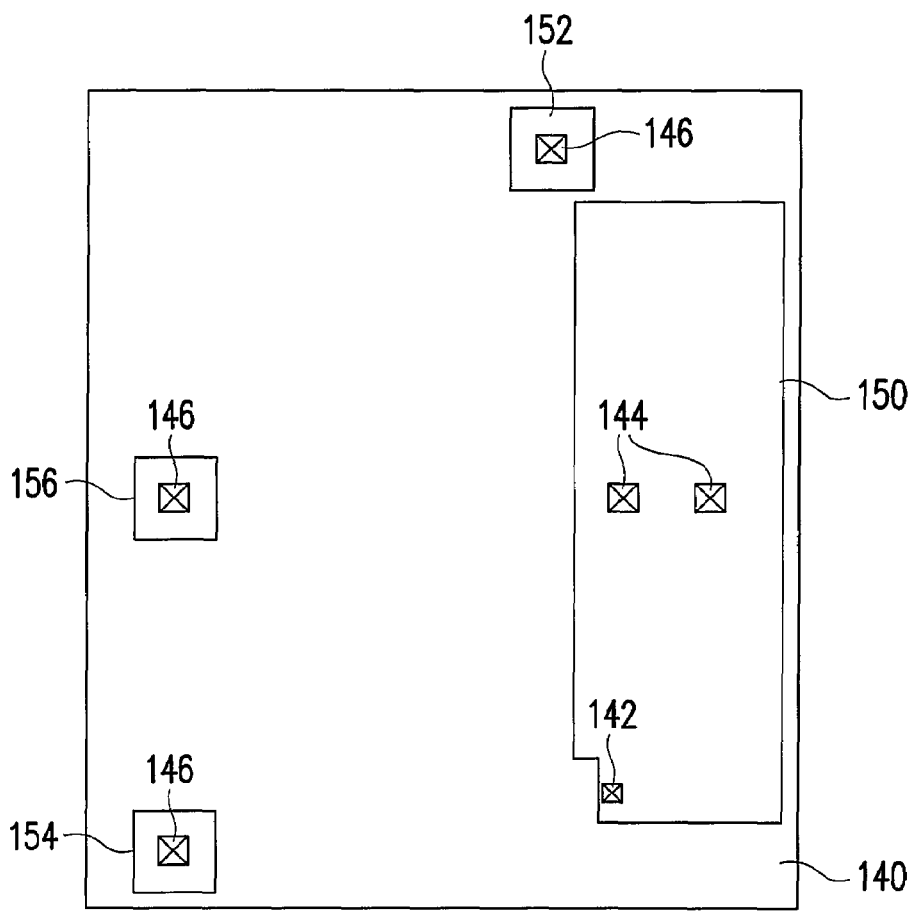
Figure 7A:
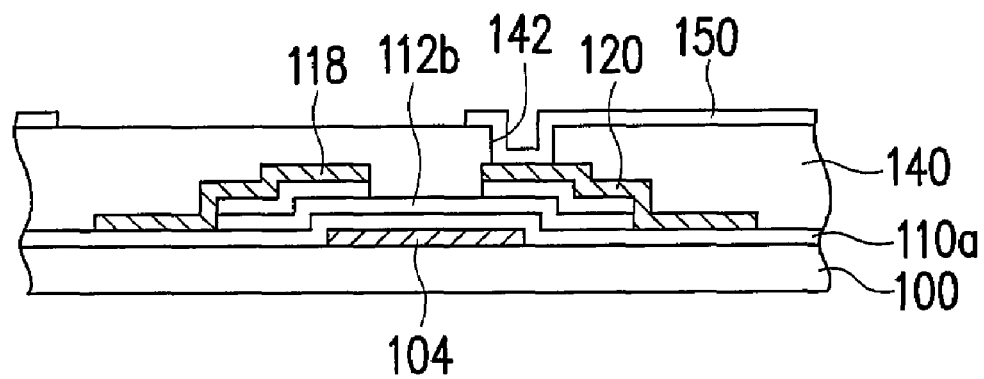
Figure 7B:
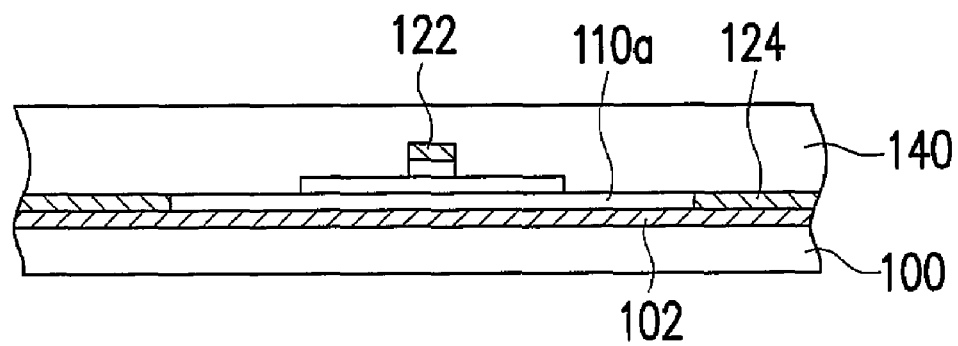
Figure 7C:
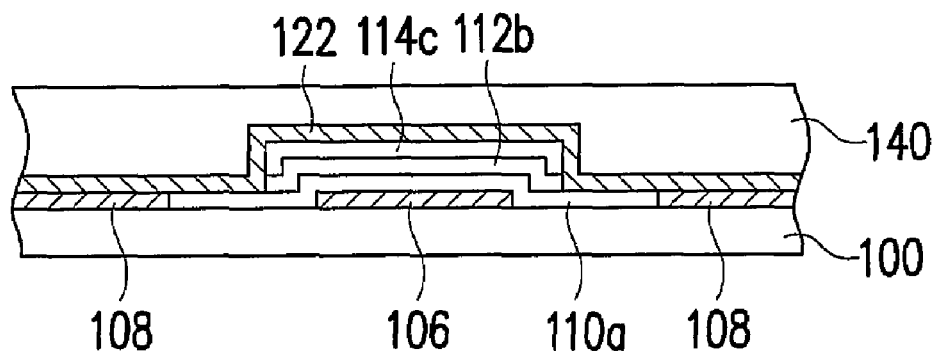

Next, referring to FIGS. 12, 12A, 12B, and 12C, a source 118 and a drain 120 are formed on the ohmic contact layer 114e, and a data line 122 electrically connected to the source 118, a top electrode 126 on the gate insulating layer 110e above the bottom electrode line 106, and at least a second auxiliary pattern 124 are formed, wherein the data line 122 is electrically connected to the exposed first auxiliary pattern 108 and the second auxiliary pattern 124 is electrically connected to the exposed scan line 102. In a preferred embodiment, the aforementioned step further comprises forming a data line terminal 128 connected to the data line 122, wherein the data line terminal 128 is electrically connected to the exposed first conductive pattern 107. Additionally, a second conductive pattern 130 is further formed on the scan line terminal 103 and contacts the exposed scan line terminal 103. Furthermore, a third conductive pattern 132 is formed on and electrically connected to the bottom electrode line terminal 105. Additionally, the top electrode 126 and the bottom electrode line 106 respectively serve as two electrodes of a storage capacitor, and the gate insulating layer 110e between the two electrodes serves as a capacitor dielectric layer. This step is the same as or similar to that of the first embodiment as shown in FIG. 5, and the details will not be described herein again.

It should be noted that the data line 122 contacts the first auxiliary pattern 108 underneath to form a parallel structure, such that the resistance value of the data line 122 is reduced. Besides the gate insulating layer 110e, a semiconductor layer 112e is disposed at the position where of the data line 122 and the scan line 102 intersect, so as to electrically isolate the two lines. Similarly, besides the gate insulating layer 110e, the semiconductor layer 112e is also disposed at the position where the data line 122 and the bottom electrode line 106 intersect, so as to electrically isolate the two lines. Additionally, the formed second auxiliary pattern 124 contacts the san line 102 underneath to form a parallel structure, thereby reducing the resistance value of the scan line 102.

Thereafter, referring to FIGS. 13, 13A, 13B, and 13C, a passivation layer 140 is formed to cover the above components which include the source 118, the drain 120, the data line 122, the second auxiliary pattern 124, the top electrode 126, and so on. In one embodiment, the material of the passivation layer 140 is the same as that of the first embodiment. Subsequently, a first contact opening 142 and a second contact opening 144 are formed in the passivation layer 140 to expose the drain 120 and the top electrode 126, respectively. In one embodiment, a contact opening 146 is further formed to expose the terminals which include the data line terminal, the scan line terminal, and the bottom electrode line terminal.

Next, referring to FIGS. 14, 14A, 14B, and 14C, a pixel electrode 150 is formed on the passivation layer 140, wherein the pixel electrode 150 is electrically connected to the drain 120 and the top electrode 126. That is, the pixel electrode 150 is electrically connected to the drain 120 and the top electrode 126 respectively through the first contact opening 142 and the second contact opening 144. In one embodiment, when the pixel electrode 150 is formed, a first contact pattern 152, a second contact pattern 154, and a third contact pattern 156 are formed respectively above the data line terminal 128, the second conductive pattern 130, and the third conductive pattern 132, wherein the first contact pattern 152 is electrically connected to the data line terminal 128, the second contact pattern 154 is electrically connected to the second conductive pattern 130, and the third contact pattern 156 is electrically connected to the third conductive pattern 132. The step is similar to that of FIG. 7, and the details will not be described herein again.

Similarly, after the pixel electrode is formed, the manufacturing of the pixel structure is completed. Then, other films such as alignment films can be formed.

In view of the above, in the present invention, since the first auxiliary pattern is formed below the data line and electrically connected to the data line, and the second auxiliary pattern is formed above the scan line and electrically connected to the scan line, the resistance values of the scan line and the data line are reduced. Therefore, the present invention can solve the problems of a large-size display panel resulting from the increase of the length of the scan line and the data line, such as flickering of display, nonuniform brightness, and different charging rates, and thus the display quality of the displayers can be improved.

In particular, the present invention adopts a halftone mask or a slit mask to form a special photoresist layer pattern and adopts a dual damascence method to achieve the purpose of reducing the resistances of the scan line and the data line, so that a large-size panel can be realized by means of single-side drive.

Additionally, the present invention employs a halftone mask or a slit mask, and a metal damascene process to enhance the process tolerance at the position where the scan line and the data line intersect, reduce the probability of short circuit of the scan line and the data line, and reduce the step height at this position, so as to avoid mura due to the uneven subsequent process.

Furthermore, in the present invention, during the manufacturing of the data line terminal and the scan line terminal, the terminals can be electrically connected to the other conductive patterns before performing the subsequent contact process and conductive layer process. Therefore, in the present invention, the electrical property of the terminals can be checked before performing the contact process, and thus the circumstance that the poor electrical connection of the terminals occurs can be detected in real time.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a pixel structure, comprising:
    forming a gate, at least one first auxiliary pattern and a scan line connected to the gate on a substrate within a region corresponding to a pixel;
    forming an insulating layer, a semiconductor layer, an ohmic contact layer, and a photoresist layer;
    performing a exposure and development process on the photoresist layer to form a first portion and a second portion and expose the ohmic contact layer over the scan line and the at least one first auxiliary pattern, wherein the first portion covers the ohmic contact layer above the gate and a part of the scan line and the second portion covers the other part of the ohmic contact layer that is not covered by the first portion and is not exposed;
    removing the exposed ohmic contact layer and semiconductor layer to expose a part of the insulating layer, and removing the second portion;
    removing the exposed insulating layer, the ohmic contact layer and the semiconductor layer to form a gate insulating layer and a channel layer, and removing the first portion;
    forming a source, a drain, at least one second auxiliary pattern, and a data line connected to the source, wherein the at least one second auxiliary pattern covers the scan line within the region corresponding to a pixel, the data line and the at least one first auxiliary pattern are connected in parallel and the at least one second auxiliary pattern and the scan line are connected in parallel;
    removing the ohmic contact layer between the source and the drain to complete a thin film transistor; and
    forming a passivation layer and a pixel electrode, the pixel electrode being electrically connected to the thin film transistor by passing through the passivation layer.

2. The method of claim 1, wherein the insulating layer, the semiconductor layer, and the ohmic contact layer are sequentially fanned.

3. The method of claim 1, wherein:
    when the gate, the scan line, and the at least one first auxiliary pattern are formed on the substrate, a bottom electrode line is further formed on the substrate;
    the first portion of the photoresist layer covers a part of the ohmic contact layer above the bottom electrode line; and
    when the source, the drain, the data line, and the at least one second auxiliary pattern are formed, a top electrode is further formed above the bottom electrode line to form a storage capacitor.

4. The method of claim 3, further comprising a step of forming a first contact opening and a second contact opening in the passivation layer after the passivation layer is formed, such that after the pixel electrode is formed on the passivation layer, the pixel electrode is electrically connected to the drain and the top electrode through the first contact opening and the second contact opening, respectively.

5. The method of claim 1, wherein:
    when the gate, the scan line, and the at least one first auxiliary pattern are formed on the substrate, a scan line terminal electrically connected to the scan line is further formed on the substrate, and a first conductive pattern is further formed on the substrate;
    the gate insulating layer further exposes a part of the scan line terminal and a part of the first conductive pattern; and
    when the source, the drain, the data line, and the at least one second auxiliary pattern are formed, a data line terminal electrically connected to the data line and a second conductive pattern are further formed, wherein the data line terminal is electrically connected to the exposed first conductive pattern and the second conductive pattern is electrically connected to the exposed scan line terminal.

6. The method of claim 5, further comprising a step of forming a first contact pattern and a second contact pattern respectively above the data line terminal and the second conductive pattern when the pixel electrode is formed, wherein the first contact pattern is electrically connected to the data line terminal and the second contact pattern is electrically connected to the second conductive pattern.

7. The method of claim 1, wherein the photoresist layer with the first portion and the second portion is formed by an exposure process using a halftone mask or a slit mask.

8. The method of claim 1, wherein the passivation layer comprises an inorganic dielectric layer, an organic planarization layer, or combination thereof.

9. The method of claim 1, wherein the thickness of the first portion of the photoresist layer is larger than that of the second portion.

10. The method of claim 1, wherein the step of removing the ohmic contact layer between the source and the drain further comprises removing a part of the thickness of the semiconductor layer.

11. The method of claim 1, wherein the insulating layer is not sandwiched between the data line and the at least one first auxiliary pattern, and the insulating layer is not sandwiched between the at least one second auxiliary pattern and the scan line.

* * * * *